United States Patent [19]

So et al.

[11] Patent Number: 5,834,966
[45] Date of Patent: Nov. 10, 1998

[54] INTEGRATED CIRCUIT SENSING AND DIGITALLY BIASING THE THRESHOLD VOLTAGE OF TRANSISTORS AND RELATED METHODS

[75] Inventors: Jason Siucheong So; Tsiu Chiu Chan, both of Carrollton, Tex.

[73] Assignee: STMicroelectronics, Inc., Carrollton, Tex.

[21] Appl. No.: 770,548

[22] Filed: Dec. 8, 1996

[51] Int. Cl.[6] .................................................. G05F 7/10
[52] U.S. Cl. .......................................... 327/534; 327/535
[58] Field of Search .................................. 327/534–537, 327/540, 541, 543, 544, 546

[56] References Cited

U.S. PATENT DOCUMENTS

| | | | |
|---|---|---|---|
| 4,142,114 | 2/1979 | Green | 307/304 |
| 4,458,212 | 7/1984 | Brehmer et al. | 330/260 |
| 4,933,827 | 6/1990 | Olivo et al. | 363/60 |
| 4,987,088 | 1/1991 | Bergonzoni et al. | 437/34 |
| 5,099,143 | 3/1992 | McClure et al. | 307/443 |
| 5,303,189 | 4/1994 | Devin et al. | 365/189.06 |
| 5,397,934 | 3/1995 | Merrill et al. | 327/534 |
| 5,672,995 | 9/1997 | Hirase et al. | 327/534 |
| 5,694,072 | 12/1997 | Hsiao et al. | 327/537 |

OTHER PUBLICATIONS

Streetman, "Solid State Electronic Devices" published by Prentice–Hall, pp. 317–319, 1980.
Pierret, "Field Effect Devices" vol. IV, published by Addison–Wesley Publishing Company, pp. 120–122, 1990.

*Primary Examiner*—Timothy P. Callahan
*Assistant Examiner*—T. T. Lam
*Attorney, Agent, or Firm*—Theodore E. Galanthay; Lisa K. Jorgenson; Christopher F. Regan

[57] ABSTRACT

An integrated circuit includes a plurality of MOSFETs on a substrate. A plurality of sensing MOSFETs are used to generate a plurality of comparison signals based upon comparing signals related to the sensed initial threshold voltages to respective reference voltages from a spread of high to low reference voltage values. The MOSFETs are biased to have a desired effective threshold voltage based upon the plurality of comparison signals. Logic decoding circuits accept the plurality of comparison signals and generate at least one bias control signal. Bias circuits are responsive to the at least one bias control signal for generating a desired bias voltage from among a plurality of bias voltages having a spread of high to low bias voltage values to thereby bias the plurality of MOSFETs to the desired effective threshold voltage. Method aspects of the invention are also disclosed.

40 Claims, 2 Drawing Sheets

INTEGRATED CIRCUIT SENSING AND DIGITALLY BIASING THE THRESHOLD VOLTAGE OF TRANSISTORS AND RELATED METHODS

FIELD OF THE INVENTION

The present invention relates to the field of semiconductors, and more particularly, to an integrated circuit comprising a plurality of metal-oxide semiconductor field-effect transistors (MOSFETs), and related methods.

BACKGROUND OF THE INVENTION

Integrated circuits are widely used in many electronic devices. A typical relatively complicated integrated circuit may include hundreds of thousands or millions of transistors on a substrate. One type of transistor commonly used in an integrated circuit is the metal-oxide semiconductor field-effect transistor (MOSFET). A MOSFET includes source and drain regions connected by a channel. A gate overlies the channel and is separated therefrom by an insulating layer, such as typically provided by silicon dioxide ($SiO_2$). A control voltage applied to the gate controls the flow of charge carriers through the channel between the source and drain.

A depletion-mode MOSFET includes a doped or conducting channel under the gate with no voltage applied to the gate. An enhancement-mode MOSFET, in contrast, requires that a gate-to-source bias voltage be applied to create an inversion layer to serve as a conducting channel. This voltage is the threshold voltage Vt. For an n-channel enhancement-mode MOSFET a positive voltage between the gate and source induces the channel. Thus, the current will only flow when the gate-to-source voltage exceeds the threshold voltage Vt. Similarly, for a p-channel enhancement-mode MOSFET, current flows when the gate-to-source voltage is negative below the negative threshold voltage.

The threshold voltage of an enhancement-mode MOSFET is determined by a number of factors, such as the channel length, channel width, doping, gate oxide thickness, etc. Extrinsic factors, such as the ambient temperature, also affect the threshold voltage. If the Vt value is too low for a desired supply voltage, the transistor may have unacceptable leakage current if the supply voltage is greater than the desired supply voltage. Conversely, if the Vt is chosen relatively high, then there is a reduced likelihood that the transistor will fully switch on. Although modern semiconductor manufacturing process can be controlled, there is still a spread of Vt values across integrated circuit dies within production runs.

It may also be desirable to use lower supply voltages for MOSFET integrated circuits to thereby reduce power consumption, such as for a cellular phone powered by a rechargeable battery, for example. Since the spread of threshold voltages based upon process variations is about the same irrespective of the supply voltage, Vt becomes a larger percentage as the supply voltage is reduced. As the supply voltage is reduced, control over Vt and the spread thereof for the transistors becomes more critical. When the supply voltages are reduced to about 1 volt or below, without accurate control of Vt, fewer and fewer integrated circuits may be acceptable as manufacturing yields decrease. Analog circuits may be particularly susceptible to variations in Vt.

U.S. Pat. No. 4,142,114 to Green, for example, discloses regulation of Vt for a plurality of MOSFETs on a common substrate which is achieved by adjusting the back bias on the substrate using a charge pump that is selectively operated when the Vt of a designated enhancement-mode FET falls below a reference voltage. A voltage divider provides the reference voltage that is applied to the gate of the designated enhancement-mode MOSFET, which when turned on enables the charge pump. The Vt of a designated enhancement-mode MOSFET is detected by applying a reference voltage to its gate. The charge pump raises the Vt of the MOSFETs on the substrate to within a predetermined range of a reference voltage. In other words, the patent discloses an example of so-called negative back gate bias, wherein the Vt of the transistors is raised. Unfortunately, raising the Vt reduces the available voltage headroom and prevents operating at lower supply voltages. Moreover, the sensing and charge pump circuit components include MOSFETs which have Vt's, that is, the variable to be controlled. In addition, a high effective threshold voltage may result in damage to relatively thin gate oxide layers of the MOSFETs.

U.S. Pat. No. 5,397,934 to Merrill et al. also discloses a compensation circuit for the threshold voltages of a plurality of MOSFETS on an integrated circuit die. In particular, a portion of the circuit generates a reference voltage. Threshold voltage monitoring circuitry includes a MOSFET transistor and a resistor connected in series therewith to generate a second voltage signal. Feedback circuitry compares the reference voltage to the second voltage signal and adjusts the effective threshold voltage of the MOS transistor so that the reference voltage is substantially equal to the second voltage signal. As described above, the compensation circuitry includes devices which are themselves subject to the variation in threshold voltage.

SUMMARY OF THE INVENTION

In view of the foregoing background, it is therefore an object of the present invention to provide an integrated circuit having MOSFETS with accurately compensated effective threshold voltages to facilitate operation at relatively low power supply voltages.

This and other objects, features and advantages in accordance with the present invention are provided by an integrated circuit comprising a plurality of MOSFETs on a substrate; a plurality of sensing MOSFETs on the substrate, each sensing MOSFET having the initial threshold voltage of the plurality of MOSFETS; comparing means for generating a plurality of comparison signals based upon comparing signals related to the sensed initial threshold voltages to respective reference voltages from a spread of high to low reference voltage values; and desired effective threshold bias means for biasing the MOSFETs to have a desired effective threshold voltage based upon the plurality of comparison signals. The desired effective bias means preferably lowers the effective threshold voltage from the initial threshold voltage to the desired effective threshold voltage. The circuit can provide high accuracy biasing since the resolution of the initial threshold voltage may be determined by the number of sensing MOSFETs and the number and spread of the reference voltages.

The comparing means preferably comprises digital output means for providing a first signal if the signal related to the sensed threshold voltage is less than or equal to a respective reference voltage for each sensing MOSFET. The digital output means also preferably provides a second signal if the signal related to the sensed threshold voltage is greater than the respective reference voltage for each sensing MOSFET. The first signal may be a supply voltage while the second signal may be ground, for example for biasing n-channel MOSFETs.

The desired effective threshold bias means may preferably include logic decoding means for accepting the plurality of comparison signals from the comparing means and for generating at least one bias control signal responsive thereto. In addition, the desired effective threshold bias means may further comprise bias means responsive to the at least one bias control signal from the logic decoding means for generating a desired bias voltage from among a plurality of bias voltages having a spread of high to low bias voltage values to thereby bias the plurality of MOSFETs to the desired effective threshold voltage.

The logic decoding means may be provided by a plurality of AND logic circuits, each having a plurality of inputs connected to the plurality of comparison signals from the comparing means. Accordingly, an arrangement of inverters may be coupled between the inputs of the AND logic circuits and the comparing means so that only one of the plurality of AND logic circuits produces the bias control signal responsive to a given combination of comparison signals.

The desired effective threshold bias means may preferably further include a plurality of bias voltage generators associated with respective outputs of the plurality of AND logic circuits. These bias voltage generators may be driven by the logic decoding means so that only one bias voltage generator is operated responsive to the bias control signal to bias the plurality of MOSFETs. Moreover, each of the bias voltage generators may comprise a voltage divider comprising a pair of resistors for providing a predetermined bias voltage from among the spread of high to low values. A pair of control transistors is preferably connected to the pair of resistors and to the output of a respective AND logic circuit for permitting current to pass through the pair of resistors responsive to the bias control signal.

The integrated circuit in one embodiment may preferably include reference voltage generating means on the substrate for generating the plurality of reference voltages having the spread of high to low reference voltage values. The reference voltage generating means may be provided by a plurality of resistor voltage dividers. In another embodiment, the reference voltages may be supplied from external to the integrated circuit.

The integrated circuit also preferably further comprises a plurality of current supply MOSFETs, each being connected to respective sensing MOSFETs. The sensing MOSFETs and the current supply MOSFETs may have channels of opposite conductivity type. Moreover, each of the current supply MOSFETs preferably has a predetermined relatively long and narrow channel so as to supply a current less than about 1 microampere.

A method aspect of the present invention is for making and operating an integrated circuit. More particularly, the method preferably comprises the steps of: forming a plurality of MOSFETs on a substrate, each MOSFET having an initial threshold voltage; and forming a plurality of sensing MOSFETs on the substrate, each sensing MOSFET having the initial threshold voltage. The method also preferably includes the steps of: generating a plurality of comparison signals based upon comparing signals related to sensed initial threshold voltages of the plurality of sensing MOSFETs to respective reference voltages from a plurality of reference voltages having a spread of high to low reference voltage values; and biasing the plurality of MOSFETs to have a desired effective threshold voltage responsive to the plurality of comparison signals.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
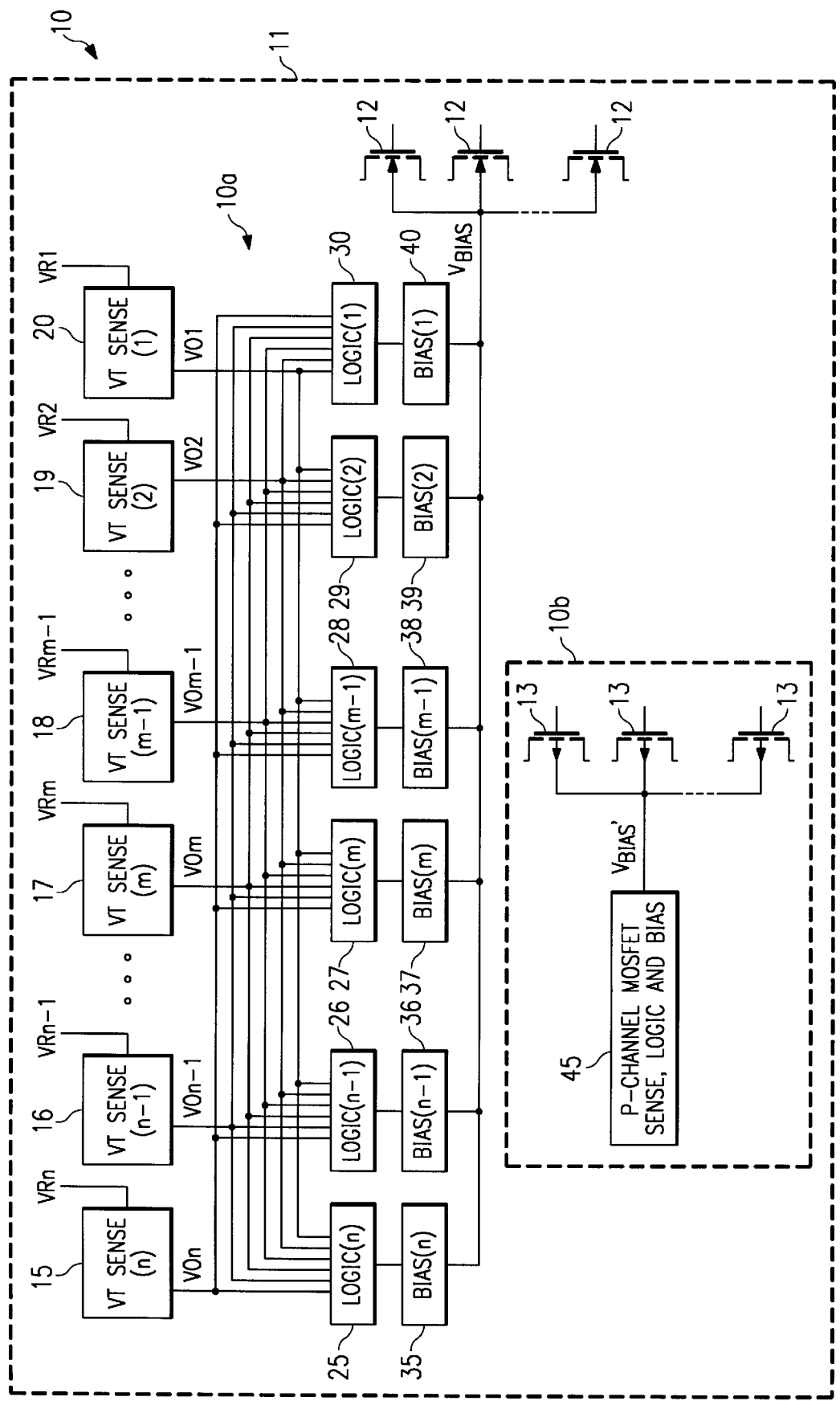
FIG. 1 is a schematic block diagram of an embodiment of an integrated circuit in accordance with the present invention.

Referring initially to FIG. 1 an integrated circuit 10 in accordance with the present invention is first described. The integrated circuit includes a substrate 11 on which a plurality of enhancement type MOSFETs are formed as would be readily understood by those skilled in the art. The illustrated integrated circuit 10 includes both p-channel MOSFETs 13 and n-channel MOSFETs 12 in a CMOS circuit as would also be readily understood by those skilled in the art.

Each n-channel and p-channel MOSFET 12, 13 has an initial threshold voltage $Vt_{INI}$ dependent at least in part on design parameters and processing variations. An active circuit is provided for actively sensing and digitally biasing the p-tubs or wells of the n-channel MOSFETs 12 with a voltage $V_{BIAS}$, for example, to produce an effective threshold voltage $Vt_{EFF}$ lower than the initial threshold voltage and at a desired or targeted value.

The lower portion of FIG. 1 schematically illustrates a circuit portion 10b providing active sensing and digital biasing for the p-channel MOSFETs 13. In particular, the second sensing and biasing circuit provides a $V_{BIAS}'$ to bias the n-tubs of the p-channel MOSFETs 13 to produce an effective threshold voltage $Vt_{EFF}$ having an absolute value less than the absolute value of the negative initial threshold voltage $Vt_{INI}$. The transistor channel types and various voltages and currents are reversed from the upper circuit portion 10a as would be readily understood by those skilled in the art.

The effective threshold voltages may set to a predetermined value, and lower supply voltages ($V_{DD}$) thereby readily accommodated for the integrated circuit 10. In addition, the lower effective threshold voltages $Vt_{EFF}$ also permit a thinner gate oxide layer while reducing the likelihood of damaging the gate oxide.

As would be readily understood by those skilled in the art, the sensing and digital biasing arrangement of the present invention may be included for an integrated circuit including only n-channel or p-channel MOSFETS. In addition, the active sensing and digital biasing arrangement may only be needed on one or the other of n-channel or p-channel MOSFETs where both types of transistors are included in the integrated circuit. For example, the active sensing and biasing may be used to produce a lowered $Vt_{EFF}$ only on the n-channel transistors, even where p-channel transistors are also included in the integrated circuit.

The upper circuit portion 10a of FIG. 1 will now be described in greater detail. The circuit 10a includes a plurality of MOSFETs 12 on the substrate, and plurality of Vt sensing circuits 15–20 as will be described in greater detail below. Each sensing circuit includes a sensing MOSFET having the initial threshold voltage of the other MOSFETs. Each sensing circuit includes a comparing circuit portion for generating a comparison signal based upon a difference between a signal related to the sensed threshold voltage and a reference voltage. More particularly, the circuit 10a includes comparing means provided by the comparing circuit portions for generating a plurality of comparison signals (VOn, VOn-1, VOm, VOm-1, VO2 and VO1) based upon comparing signals related to the sensed initial threshold voltages to respective reference voltages, and wherein the reference voltages (VRn, VRn-1, VRm, VRm-1, VR2, and VR1) have a spread of high to low reference voltage values.

The comparison signals are fed to the illustrated logic circuits 25–30 and respective bias circuits 35–40 for biasing the MOSFETs 12 to have a desired effective threshold voltage responsive to the plurality of comparison signals. The desired effective threshold voltage is preferably lower than the initial threshold voltage to provide additional voltage headroom for the integrated circuit 10. In other words, the initial threshold voltage of the MOSFETs 12 may be desirably targeted high in the manufacturing process. The sensing and biasing circuit 10a brings the initial threshold voltage down to the desired level.

The bias circuits 35–40 also preferably have a spread of high to low values corresponding to a range of corrections that may be needed dependent upon the actual process variation of an integrated circuit die. For example, the initial threshold voltage may vary about 0.020 to 0.030 volts from one integrated circuit die on one portion of a wafer to a second integrated circuit die on another portion of the same wafer. In addition, for different wafer lots, the initial threshold voltages may vary up to about 0.15 volts between different integrated circuits in different lots, as would be readily understood by those skilled in the art.

Those of skill in the art will also recognize that the Vt for transistors on a typical single integrated circuit die may also have a spread of high to low values about an average value. The spread of high to low Vt values for an individual integrated circuit is smaller than the spread from spaced integrated circuits on a single wafer, and considerably smaller than the spread for integrated circuits in different wafer lots as would also be readily understood by those skilled in the art. Accordingly, for the purposes of the present invention, the initial threshold voltages for the transistors on a single integrated circuit, although possibly having a slight spread of values, may be treated as being the same.

The Vt sensing circuits 15–20 preferably each comprise digital output means for providing a first signal if the sensed threshold voltage is less than a respective reference voltage for each sensing MOSFET, and a second signal if the sensed threshold voltage is greater than or equal to the respective reference voltage for each sensing MOSFET. The first signal may be the supply voltage $V_{DD}$ while the second signal may be ground $V_{SS}$ for example.

The logic circuits 35–40 provide logic decoding means for accepting the plurality of comparison signals and for generating at least one control signal responsive thereto. For example, for the situation where n>m>2, and the reference voltages are such that VRn>VRn-1>VRm>VRm-1>VR2>VR1, and the threshold voltage Vt is between VRm and VRm-1, then comparison signals VOn to VOm will be at $V_{SS}$, and comparison signals VOm-1 to VO1 will be at $V_{DD}$. Accordingly, the logic circuits 25–30 may be configured so that only one is generating a bias control signal, and, therefore, only one of the bias circuits 35–40 is enabled so that a predetermined respective bias voltage is provided responsive to the sensed effective threshold. In other words, the desired effective threshold bias means is responsive to the at least one bias control signal from the logic decoding means provided by the logic circuits 25–30 for generating a desired bias voltage from among a plurality of bias voltages capable of being supplied from the bias voltage generators 35–40.

The sensing, logic and biasing circuits as described in detail with respect to the upper circuit portion 10a for the n-channel MOSFETs 12 may be readily duplicated for the p-channel MOSFETs 13 with consideration for opposite channel conductivities and current flows, for example, as would be readily understood by those skilled in the art. The schematically illustrated p-channel MOSFET sensing, logic and bias circuit 45 provides a bias voltage $V_{BIAS}'$ to the p-channel MOSFETs to move the effective threshold voltage to a desired threshold voltage.

Figure 2:
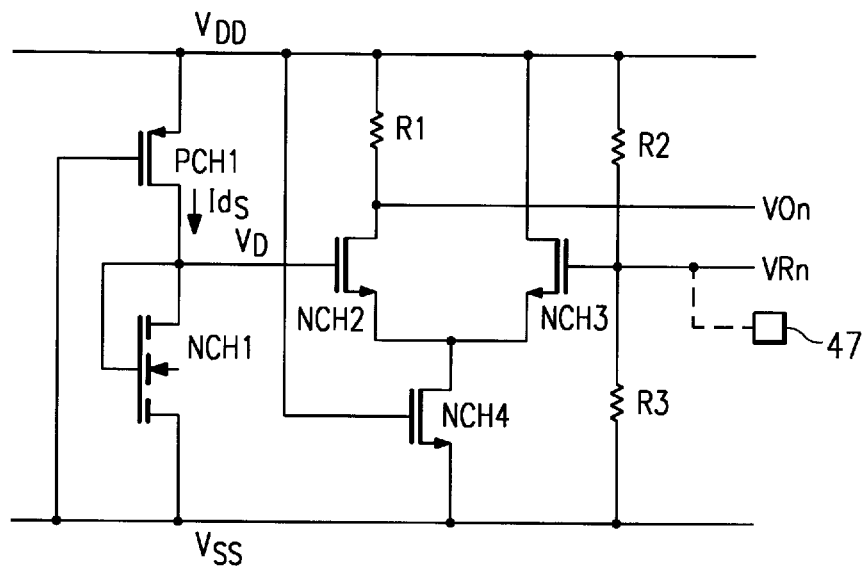
FIG. 2 is a schematic circuit diagram of a portion of the integrated circuit in accordance with the present invention.

Turning now to the schematic circuit diagram of FIG. 2, a Vt sensing circuit 15 of the upper circuit portion 10a (FIG. 1) is further described. In particular, the illustrated current driving p-channel MOSFET PCH1 is biased so as to be always on or in the pinch-off region by connecting its source to $V_{DD}$ and its gate to $V_{SS}$ as would be readily understood by those skilled in the art. The size selection of PCH1 should provide a long and narrow channel for the gate so as to supply a relatively low current $I_{ds}$ to the sensing MOSFET NCH1. Preferably the current supplied $I_{ds}$ is less than about 1 microamp and, more preferably in the range of 10 nanoamps or less. As illustrated, the gate and drain of the sensing transistor NCH1 are connected together and to the drain of current driving transistor PCH1. Transistors NCH1 and PCH1 may thus be considered as providing threshold voltage sensing and producing a control signal $V_D$ responsive to the sensed threshold voltage of transistor NCH1 as $V_D$ is a function of the sensed threshold voltage.

For the case where the control signal $V_D$ is lower than the voltage reference VRn, transistor NCH2 is biased off and the voltage comparison signal VOn at the node defined by resistor R1 and the drain of NCH2 is almost equal to $V_{DD}$. Transistor NCH2 remains off as long as the control voltage $V_D$ is smaller than the reference voltage VRn. Transistor NCH2 has its drain connected to $V_{DD}$ through resistor R1. If $V_D$ is greater than VRn, the transistor NCH2 turns on and the comparison signal VOn changes to near the ground voltage $V_{SS}$ as would be readily understood by those skilled in the art. These high and low comparison signals may be made closer to $V_{DD}$ and $V_{SS}$ by passing the signals through several inverters, as would be readily appreciated by those skilled in the art.

As shown in the illustrated embodiment, the voltage reference VRn can be supplied by the on-chip resistor voltage divider provided by resistors R2 and R3. The reference voltage VRn is applied to the gate of transistor NCH3 which has its drain connected to $V_{DD}$ and its source connected to the drain of transistor NCH4 and the source of NCH2 as illustrated. Alternately, the voltage reference may be supplied from off-chip via the illustrated pin 47.

As would be readily appreciated by those skilled in the art, the illustrated Vt sensing circuit 15 may be duplicated many times on the integrated circuit 10. The values of the reference voltages may be readily set to provide any desired resolution of threshold voltage sensing and biasing as would also be readily understood by those skilled in the art.

Figure 3:
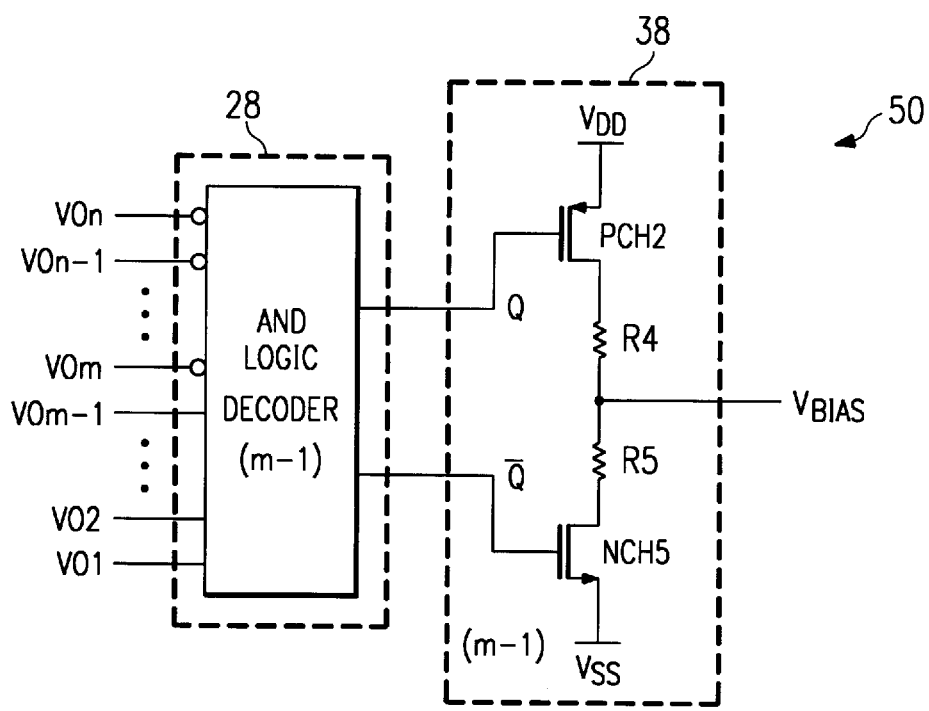
FIG. 3 is a schematic circuit diagram of another portion of the integrated circuit in accordance with the present invention.

Turning now more particularly to FIG. 3, a logic decoding and biasing circuit portion 50 is further described. The illustrated circuit portion includes both a logic decoding circuit 28 and a bias circuit 38. of course, the logic decoding means of the invention may be provided by a plurality of AND logic circuits 28, each having a plurality of inputs connected to the plurality of comparison signals VOn–VO1 from the comparing means. Accordingly, an arrangement of inverters may be coupled between the inputs of the AND logic circuits and the comparing means so that only one of the plurality of AND logic circuits produces a bias control signal responsive to a given combination of comparison signals.

As shown in the illustrated AND logic decoder circuit 28 the inputs VOn, VOn-1 and VOm are coupled through inverting inputs. Accordingly, a bias control signal to operate the bias circuit 38 is provided only if the sensing circuits 15–20 are as described above with the sensed initial threshold voltage falling between VRm and VRm-1. Although an AND logic decoder circuit 28 with inversion of predetermined inputs is described in this embodiment, there are many other logic circuits that may implement selective operation of a desired bias circuit as would be readily understood by those skilled in the art.

A bias voltage generator 38 in accordance with the present invention is also illustrated in the right hand portion of FIG. 3. The bias voltage generator 38 includes a voltage divider provided by resistors R4 and R5 providing the $V_{BIAS}$ output signal to bias the MOSFETs. Current is permitted to flow through the voltage divider by the pair of transistors PCH2 and NCH5. Transistor PCH2 has its gate coupled to the output Q of the AND logic decoder 28, its source connected to $V_{DD}$, and its drain connected to resistor R4. Similarly, transistor NCH5 has its gate connected to the complimentary output Q of the AND logic decoder, its source connected to Vss and its drain connected to resistor R5. Other bias voltage generating circuits are also contemplated by the present invention as will be readily appreciated by those skilled in the art.

The circuit 10a (FIG. 1) may include a plurality of such bias voltage generators and wherein only a single generator having a desired bias voltage from among a spread of such voltages is operated at any given time. In other embodiments of the invention, the logic decoding may be configured to operate combinations of bias voltage generators to achieve a desired bias for a given sensed threshold voltage. In addition, should the threshold voltage change, such as by temperature effects, the sensing and biasing of the present invention may retarget the threshold voltage to the desired value as would be readily understood by those skilled in the art.

A method aspect of the present invention is for making and operating an integrated circuit 10 as shown in FIG. 1. More particularly, the method preferably comprises the steps of: forming a plurality of MOSFETs 12 on a substrate 11, each MOSFET having an initial threshold voltage; and forming a plurality of sensing MOSFETs NCH1 (FIG. 2) on the substrate, each sensing MOSFET having the initial threshold voltage. The method also preferably includes the steps of: generating a plurality of comparison signals VOn–VO1 based upon comparing signals related to the sensed initial threshold voltages of the plurality of sensing MOSFETs to respective reference voltages from a plurality of reference voltages VRn–VO1 having a spread of high to low reference voltage values; and biasing the plurality of MOSFETs to have a desired effective threshold voltage responsive to the plurality of comparison signals.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated circuit comprising:

a substrate;

a plurality of metal-oxide semiconductor field-effect transistors (MOSFETS) on said substrate, each MOSFET having an initial threshold voltage;

a plurality of sensing MOSFETs on said substrate, each sensing MOSFET having the initial threshold voltage;

comparing means for generating a plurality of comparison signals based upon comparing signals related to sensed initial threshold voltages of said plurality of sensing MOSFETs to respective reference voltages from a plurality of reference voltages having a spread of high to low reference voltage values; and desired effective threshold bias means for biasing said plurality of MOSFETs to have a desired effective threshold voltage based upon the plurality of comparison signals.

2. An integrated circuit according to claim 1 wherein said comparing means comprises digital output means for providing a first signal when the signal related to the sensed initial threshold voltage is less than or equal to a respective reference voltage, and for providing a second signal when the signal related to the sensed initial threshold voltage is greater than the respective reference voltage.

3. An integrated circuit according to claim 1 wherein said desired effective threshold bias means comprises logic decoding means for accepting the plurality of comparison signals from said comparing means and for generating at least one bias control signal responsive thereto.

4. An integrated circuit according to claim 3 wherein said desired effective threshold bias means further comprises bias means responsive to the at least one bias control signal from said logic decoding means for generating a desired bias voltage from among a plurality of bias voltages having a spread of high to low bias voltage values to thereby bias said plurality of MOSFETs to the desired effective threshold voltage.

5. An integrated circuit according to claim 3 wherein said logic decoding means further comprises:

a plurality of AND logic circuits, each having a plurality of inputs connected to the plurality of comparison signals from said comparing means; and an arrangement of inverters coupled between the inputs of said plurality of AND logic circuits and said comparing means so that only one of said plurality of AND logic circuits produces the bias control signal responsive to a given combination of comparison signals.

6. An integrated circuit according to claim 5 wherein said desired effective threshold bias means further comprises a plurality of bias voltage generators associated with respective outputs of said plurality of AND logic circuits and having a spread of high to low bias voltage values.

7. An integrated circuit according to claim 6 wherein each of said plurality of bias voltage generators comprises:

a voltage divider comprising a pair of resistors; and a pair of control transistors connected to said pair of resistors and to the output of a respective AND logic circuit for permitting current to pass through said pair of resistors responsive to the bias control signal.

8. An integrated circuit according to claim 1 further comprising reference voltage generating means on said substrate for generating the plurality of reference voltages having the spread of high to low reference voltage values.

9. An integrated circuit according to claim 8 wherein said reference voltage generating means comprises a plurality of resistor voltage dividers.

10. An integrated circuit according to claim 1 further comprising a plurality of current supply MOSFETS, each being connected to respective sensing MOSFETs; and wherein said sensing MOSFETs and said current supply MOSFETs have channels of opposite conductivity type.

11. An integrated circuit according to claim 10 wherein each of said current supply MOSFETs has a predetermined relatively long and narrow channel so as to supply a current less than about 1 microampere.

12. An integrated circuit according to claim 1 wherein said desired effective bias means comprises means for biasing said plurality of MOSFETs to have a lower desired effective threshold voltage than the initial threshold voltage.

13. An integrated circuit comprising:
a substrate;
a plurality of metal-oxide semiconductor field-effect transistors (MOSFETs) on said substrate, each MOSFET having an initial threshold voltage;
a plurality of sensing MOSFETs on said substrate, each sensing MOSFET having the initial threshold voltage;
reference voltage generating means on said substrate for generating a plurality of reference voltages having a spread of high to low reference voltage values;
comparing means for generating a plurality of comparison signals based upon comparing signals related to sensed initial threshold voltages of said plurality of sensing MOSFETs to respective reference voltages from the plurality of reference voltages; and
desired effective threshold bias means for biasing said plurality of MOSFETs to have a desired effective threshold voltage lower than the initial threshold voltage and based upon the plurality of comparison signals.

14. An integrated circuit according to claim 13 wherein said comparing means comprises digital output means for providing a first signal when the signal related to the sensed initial threshold voltage is less than or equal to a respective reference voltage, and for providing a second signal when the signal related to the sensed initial threshold voltage is greater than the respective reference voltage.

15. An integrated circuit according to claim 13 wherein said desired effective threshold bias means comprises logic decoding means for accepting the plurality of comparison signals from said comparing means and for generating at least one bias control signal responsive thereto.

16. An integrated circuit according to claim 15 wherein said desired effective threshold bias means further comprises bias means responsive to the at least one bias control signal from said logic decoding means for generating a desired bias voltage from among a plurality of bias voltages having a spread of high to low bias voltage values to thereby bias said plurality of MOSFETs to the desired effective threshold voltage.

17. An integrated circuit according to claim 15 wherein said logic decoding means further comprises:
a plurality of AND logic circuits, each having a plurality of inputs connected to the plurality of comparison signals from said comparing means; and
an arrangement of inverters coupled between the inputs of said plurality of AND logic circuits and said comparing means so that only one of said plurality of AND logic circuits produces the bias control signal responsive to a given combination of comparison signals.

18. An integrated circuit according to claim 17 wherein said desired effective threshold bias means further comprises a plurality of bias voltage generators associated with respective outputs of said plurality of AND logic circuits and having a spread of high to low bias voltage values.

19. An integrated circuit according to claim 18 wherein each of said plurality of bias voltage generators comprises:
a voltage divider comprising a pair of resistors; and
a pair of control transistors connected to said pair of resistors and to the output of a respective AND logic circuit for permitting current to pass through said pair of resistors responsive to the bias control signal.

20. An integrated circuit according to claim 13 wherein said reference voltage generating means comprises a plurality of resistor voltage dividers.

21. An integrated circuit according to claim 13 further comprising a plurality of current supply MOSFETs, each being connected to respective sensing MOSFETs; and wherein said sensing MOSFETs and said current supply MOSFETs have channels of opposite conductivity type.

22. An integrated circuit according to claim 21 wherein each of said current supply MOSFETs has a predetermined relatively long and narrow channel so as to supply a current less than about 1 microampere.

23. An integrated circuit comprising:
a substrate;
a plurality of metal-oxide semiconductor field-effect transistors (MOSFETs) on said substrate, each MOSFET having an initial threshold voltage;
a plurality of sensing MOSFETs on said substrate, each sensing MOSFET having the initial threshold voltage;
comparing means for generating a plurality of comparison signals based upon comparing signals related to sensed initial threshold voltages of said plurality of sensing MOSFETs to respective reference voltages from a plurality of reference voltages having a spread of high to low reference voltage values;
logic decoding means for accepting the plurality of comparison signals from said comparing means and for generating at least one bias control signal responsive thereto; and
bias means responsive to the at least one control signal from said logic decoding means for generating a desired bias voltage from among a plurality of bias voltages having a spread of high to low bias voltage values to thereby bias said plurality of MOSFETs to a desired effective threshold voltage.

24. An integrated circuit according to claim 23 wherein said comparing means comprises digital output means for providing a first signal when the signal related to the sensed initial threshold voltage is less than or equal to a respective reference voltage, and for providing a second signal when the signal related to the sensed initial threshold voltage is greater than the respective reference voltage.

25. An integrated circuit according to claim 23 wherein said logic decoding means further comprises:
a plurality of AND logic circuits, each having a plurality of inputs connected to the plurality of comparison signals from said comparing means; and
an arrangement of inverters coupled between the inputs of said plurality of AND logic circuits and said comparing means so that only one of said plurality of AND logic circuits produces the bias control signal responsive to a given combination of comparison signals.

26. An integrated circuit according to claim 25 wherein said bias means further comprises a plurality of bias voltage generators associated with respective outputs of said plurality of AND logic circuits.

27. An integrated circuit according to claim 26 wherein each of said plurality of bias voltage generators comprises:

a voltage divider comprising a pair of resistors; and a pair of control transistors connected to said pair of resistors and to the output of a respective AND logic circuit for permitting current to pass through said pair of resistors responsive to the bias control signal.

28. An integrated circuit according to claim 23 further comprising reference voltage generating means on said substrate for generating the plurality of reference voltages having the spread of high to low reference voltage values.

29. An integrated circuit according to claim 28 wherein said reference voltage generating means comprises a plurality of resistor voltage dividers.

30. An integrated circuit according to claim 23 further comprising a plurality of current supply MOSFETs, each being connected to respective sensing MOSFETs; and wherein said sensing MOSFETs and said current supply MOSFETs have channels of opposite conductivity type.

31. An integrated circuit according to claim 30 wherein each of said current supply MOSFETs has a predetermined relatively long and narrow channel so as to supply a current less than about 1 microampere.

32. An integrated circuit according to claim 23 wherein said bias means comprises means for biasing said plurality of MOSFETs to have a lower desired effective threshold voltage than the initial threshold voltage.

33. A method for making and operating an integrated circuit comprising the steps of:

forming a plurality of metal-oxide semiconductor field-effect transistors (MOSFETs) on a substrate, each MOSFET having an initial threshold voltage;

forming a plurality of sensing MOSFETs on the substrate, each sensing MOSFET having the initial threshold voltage;

generating a plurality of comparison signals based upon comparing signals related to sensed initial threshold voltages of said plurality of sensing MOSFETs to respective reference voltages from a plurality of reference voltages having a spread of high to low reference voltage values; and biasing the plurality of MOSFETs to have a desired effective threshold voltage based upon said plurality of comparison signals.

34. A method according to claim 33 wherein the step of generating the comparison signals comprises providing a first signal when the signal related to the sensed initial threshold voltage is less than or equal to a respective reference voltage, and providing a second signal when the signal related to the sensed initial threshold voltage is greater than the respective reference voltage.

35. A method according to claim 33 wherein the step of biasing comprises generating at least one bias control signal responsive to the plurality of comparison signals.

36. A method according to claim 35 wherein the step of biasing further comprises generating a desired bias voltage from among a plurality of bias voltages having a spread of high to low bias voltage values bias means responsive to the at least one bias control signal to thereby bias said plurality of MOSFETs to the desired effective threshold voltage.

37. A method according to claim 36 wherein the step of biasing further comprises the steps of:

forming a plurality of AND logic circuits on the substrate, each having a plurality of inputs connected to the plurality of comparison signals; and coupling an arrangement of inverters between the inputs of said plurality of AND logic circuits and the comparison signals so that only one of said plurality of AND logic circuits produces the bias control signal responsive to a given combination of comparison signals.

38. A method according to claim 37 wherein the step of biasing further comprises the step of forming a plurality of bias voltage generators associated with respective outputs of said plurality of AND logic circuits.

39. A method according to claim 33 further comprising the step of generating the plurality of reference voltages having the spread of high to low reference voltage values on the substrate.

40. A method according to claim 33 further comprising the step of providing the plurality of reference voltages having the spread of high to low reference voltage values from external to the substrate.

* * * * *